US008497518B2

(12) United States Patent
Li

(10) Patent No.: US 8,497,518 B2
(45) Date of Patent: Jul. 30, 2013

(54) LIGHT EMITTING DIODE

(75) Inventor: Kuo-Yuin Li, Tainan County (TW)

(73) Assignee: Chi Mei Lighting Technology Corp, Tainan County (TW)

( * ) Notice: Subject to any disclaimer, the term of this patent is extended or adjusted under 35 U.S.C. 154(b) by 1314 days.

(21) Appl. No.: 11/869,605

(22) Filed: Oct. 9, 2007

(65) Prior Publication Data

US 2009/0032830 A1   Feb. 5, 2009

(30) Foreign Application Priority Data

Aug. 3, 2007 (TW) ................................ 96128760 A

(51) Int. Cl.
*H01L 33/46* (2010.01)
(52) U.S. Cl.
USPC ................. 257/98; 257/94; 257/E21.121
(58) Field of Classification Search
USPC ............ 257/79, E33.001, E21.249, E21.121, 257/E21.133, 13–15, 59, 88, 94–103; 438/31, 438/481

See application file for complete search history.

(56) References Cited

U.S. PATENT DOCUMENTS

| | | | | |
|---|---|---|---|---|
| 6,015,979 A * | 1/2000 | Sugiura et al. | ................... | 257/86 |
| 6,483,127 B2 | 11/2002 | Saeki | | |
| 6,693,352 B1 * | 2/2004 | Huang et al. | ................... | 257/743 |
| 2001/0004488 A1 * | 6/2001 | Morita | ................... | 428/209 |
| 2002/0145147 A1 * | 10/2002 | Chiou et al. | ................... | 257/79 |
| 2005/0062049 A1 * | 3/2005 | Lin et al. | ................... | 257/79 |
| 2005/0121681 A1 * | 6/2005 | Oku et al. | ................... | 257/97 |
| 2005/0248830 A1 * | 11/2005 | Sawin et al. | ................... | 359/321 |
| 2006/0214287 A1 * | 9/2006 | Ogihara et al. | ................... | 257/723 |
| 2007/0012937 A1 * | 1/2007 | Liu et al. | ................... | 257/99 |
| 2007/0018186 A1 * | 1/2007 | Shin et al. | ................... | 257/98 |
| 2007/0085093 A1 * | 4/2007 | Ohmae et al. | ................... | 257/89 |

FOREIGN PATENT DOCUMENTS

| | | |
|---|---|---|
| JP | 2007-109793 A | 4/2007 |
| TW | 483205 B | 4/2002 |

OTHER PUBLICATIONS

Sugawara et al., High-brightness InGaAIP green light-emitting diodes, Appl. Phys. Lett. 61 (15), 1775-1777, Oct. 12, 1992 (American Institute of Physics).
Kish et al., Very high-efficiency semiconductor wafer-bonded transparent-substrate (AlxGa1-x)0.5In0.5P/GaP light-emitting diodes, Appl. Phys. Lett 64 (21), 2839-2841, May 23, 1994 (American Institute of Physics).
Horng et al., AlGaInP light-emitting diodes with mirror substrates fabricated by wafer-bonding, Appl. Phys. Lett. 75 (20), 3054-3056, Nov. 15, 1999 (American Institute of Physics).

* cited by examiner

*Primary Examiner* — Cuong Q Nguyen
*Assistant Examiner* — Yosef Gebreyesus
(74) *Attorney, Agent, or Firm* — Morris Manning & Martin LLP; Tim Tingkang Xia, Esq.

(57) ABSTRACT

A light-emitting diode and the manufacturing method thereof are disclosed. The manufacturing method comprises the steps of: sequentially forming a refraction dielectric layer, a bonding layer, an epitaxy structure and a first electrode on a permanent substrate, wherein the epitaxy structure comprises a first conductivity type semiconductor layer, an active layer and a second conductivity type semiconductor layer stacked in sequence; and forming a second electrode on the portion surface of the second conductivity type semiconductor layer. Therefore the light-emitting diode is achieved.

9 Claims, 8 Drawing Sheets

LIGHT EMITTING DIODE

RELATED APPLICATIONS

The present application is based on, and claims priority from, Taiwan Application Serial Number 96128760, filed Aug. 3, 2007, the disclosure of which is hereby incorporated by reference herein in its entirety.

FIELD OF THE INVENTION

This invention relates to a lead frame structure of a light emitting diode and a manufacturing method thereof, and more particularly, to a light emitting diode with high light extraction efficiency and a manufacturing method thereof.

BACKGROUND OF THE INVENTION

A light emitting diode (LED) is composed of an epitaxial structure such as a homo-structure, a single hetero-structure, a double hetero-structure or a multiple quantum well. The LED with a p-n junction interface that can emit light with various wavelengths has several beneficial characteristics, including low electrical power consumption, low heat generation, long operational life, small volume, good impact resistance, fast response and excellent stability. These characteristics have made the LED popular for integration into electrical appliances and electronic devices as a light source.

Typically, an LED is composed of an epitaxial structure with a substrate, an n-type cladding layer formed over the substrate, a p-type cladding layer and an active layer formed between the n-type cladding layer and the p-type cladding layer. Light is emitted as current flows through the epitaxial structure. The light wavelength can be altered by varying the composition of the epitaxial structure material.

In general, the light output of an LED depends on the quantum efficiency of the active layer and the light extraction efficiency. The higher the quantum efficiency of the active layer, the higher the light output of the light-emitting diode. Generally, improving the quality of epitaxial structure and the structural design of the active layer increases the quantum efficiency of the active layer. In addition, as the light extraction efficiency increases, the light output of the light-emitting diode is enhanced. In order to improve the light extraction efficiency, efforts are made to overcome the significant photon loss resulting from total reflection inside the light-emitting diode after emission from the active layer.

When the light generated by the active layer of the conventional LED is emitted downward to a GaAs substrate for example, the light will be absorbed by the GaAs substrate since the GaAs substrate has a smaller energy gap. Accordingly, the light-output performance of the LED will be greatly reduced.

There are some conventional LED technologies that have been disclosed in order to avoid the absorption of light by the substrate. However, these conventional technologies still have some disadvantages and limitations. For example, Sugawara et al. disclosed a method, which was published in Appl. Phys Lett. Vol. 61, 1775-1777 (1992), that added a distributed bragg reflector (DBR) layer on the GaAs substrate so as to reflect the light emitted downward to the GaAs substrate and to decrease the light absorbed by the GaAs substrate. However, because the DBR layer only reflects light that is of near normal incidence to the GaAs substrate, the efficiency is not very great.

Kish et al. disclosed a wafer-bonded transparent-substrate (TS) $(Al_xGa_{1-x})_{0.5}In_{0.5}P/GaP$ light emitting diode [Appl. Phys Lett. Vol. 64, No. 21, 2839 (1994); Very high-efficiency semiconductor wafer-bonded transparent-substrate $(Al_xGa_{1-x})_{0.5}In_{0.5}P/GaP]$. This TS AlGaInP LED was fabricated by growing a very thick (about 50 µm) p-type GaP window layer using hydride vapor phase epitaxy (HVPE). Before bonding, the n-type GaAs substrate was selectively removed using chemical mechanical polishing and etching techniques. The exposed n-type $(Al_xGa_{1-x})_{0.5}In_{0.5}P$ cladding layers are subsequently wafer-bonded to 8-10 mil thick n-type GaP substrate. The resulting TS AlGaInP LED exhibits a two fold improvement in light output compared to absorbing substrate (AS) AlGaInP LED. However, the fabrication process of TS AlGaInP LED is too complicated. Therefore, it is difficult to manufacture these TS AlGaInP LEDs in high yield and low cost.

Horng et al. reported a mirror-substrate (MS) AlGaInP/metal/$SiO_2$/Si LED fabricated by wafer-fused technology [Appl. Phys Lett. Vol. 75, No. 20, 3054 (1999); AlGaInP light-emitting diodes with mirror substrates fabricated by wafer bonding]. They used the AuBe/Au as the adhesive to bond the Si substrate and LED epilayers. However, the luminous intensity of these MS AlGaInP LEDs is about 90 mcd with 20 mA injection current and is still 40% lower than the luminous intensity of TS AlGaInP LED.

SUMMARY OF THE INVENTION

Therefore, an aspect of the present invention is to provide a light emitting diode to increase the light extraction efficiency and raise the light emitting efficiency thereof.

According to an embodiment of the present invention, the light emitting diode comprises a transparent substrate, a refraction dielectric layer, a bonding layer, an epitaxy structure, a first electrode and a second electrode. The refraction dielectric layer is formed on the transparent substrate. The bonding layer is formed on the refraction dielectric layer. The epitaxy structure is formed on the bonding layer, wherein the epitaxy structure comprises a second conductivity type semiconductor layer, an active layer and a first conductivity type semiconductor layer. The second conductivity type semiconductor layer is formed on the bonding layer and has a portion surface exposed. The active layer is formed on the second conductivity type semiconductor layer. The first conductivity type semiconductor layer is formed on the active layer, wherein the first conductivity type semiconductor layer and the second conductivity type semiconductor layer have different conductivity types. The second electrode is formed on the portion surface of the second conductivity type semiconductor layer. The first electrode is formed on the first conductivity type semiconductor layer.

According to another embodiment of the present invention, the method for manufacturing the light emitting diode comprises: providing a growth substrate; forming an epitaxy structure on the growth substrate, wherein the epitaxy structure comprises a first conductivity type semiconductor layer, an active layer and a second conductivity type semiconductor layer stacked in sequence, and the first conductivity type semiconductor layer and the second conductivity type semiconductor layer have different conductivity types; providing a transparent substrate; forming a refraction dielectric layer on the transparent substrate; forming a bonding layer on the refraction dielectric layer; bonding the epitaxy structure on the bonding layer; removing the growth substrate; etching a portion of the first conductivity type semiconductor layer and a portion of the active layer to expose a portion surface of the second conductivity type semiconductor layer; forming a second electrode on the portion surface of the second conductivity type semiconductor layer; and forming a first electrode on the first conductivity type semiconductor layer.

Therefore, with the application of the light emitting diode disclosed in the embodiments of the present invention, the light emitting diode of the present invention can use the refraction dielectric layer to refract the inner light thereof, thereby increasing the light extraction efficiency and the light emitting efficiency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
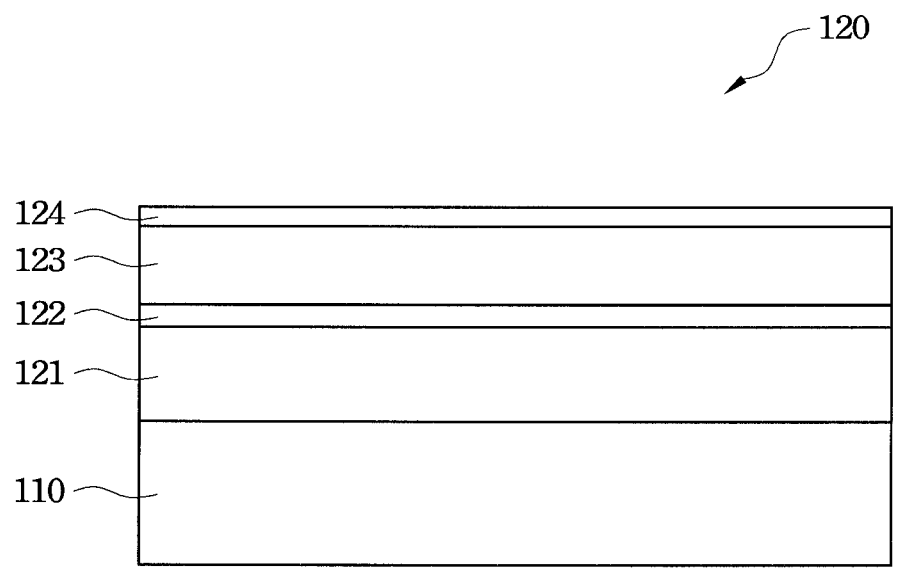
FIG. 1A through FIG. 1F are schematic flow diagrams showing the process for manufacturing a light emitting diode according to a first embodiment of the present invention.

In order to make the illustration of the present invention more explicit and complete, the following description is stated with reference to FIG. 1A through FIG. 5B.

Refer to FIG. 1A through FIG. 1F. FIG. 1A through FIG. 1F are schematic flow diagrams showing the process for manufacturing a light emitting diode according to a first embodiment of the present invention. The light emitting diode 100 of the first embodiment comprises an epitaxy structure 120, a bonding layer 130, a refraction dielectric layer 140, a transparent substrate 150, a first electrode 160, a second electrode 170, and an insulating protecting layer 180. The refraction dielectric layer 140, bonding layer 130 and epitaxy structure 120 are stacked on the transparent substrate 150 in sequence, wherein the epitaxy structure 120 has a first conductivity type semiconductor layer 121, an active layer 122, a second conductivity type semiconductor layer 123, a second conductivity type contact layer 124 and a first conductivity type contact layer 125, and the second conductivity type semiconductor layer 123 has a portion surface 123a exposed. The first electrode 160 is formed on the first conductivity type contact layer 125, and the second electrode 170 is formed on the exposed portion surface 123a of the second conductivity type semiconductor layer 123, thereby forming a lateral-conducting structure.

Refer to FIG. 1A again. First, the growth substrate 110 is provided, wherein the material thereof may be GaAs, Si, SiC, AlN, sapphire, InP or GaP. Next, the epitaxy structure 120 is formed on the growth substrate 110. The epitaxy structure 120 is formed by an epitaxy method such as metal organic chemical vapor deposition (MOCVD), liquid phase epitaxy (LPE) or molecular beam epitaxy (MBE). The first conductivity type semiconductor layer 121, the active layer 122, the second conductivity type semiconductor layer 123 and the second conductivity type contact layer 124 are stacked on the growth substrate 110 in sequence, wherein the first conductivity type semiconductor layer 121 and the second conductivity type semiconductor layer 123 are different conductivity types. In this embodiment, the first conductivity type and the second conductivity type are opposite conductivity types. That is, when the first conductivity type is P-type, the second conductivity type is N-type; conversely, when the first conductivity type is N-type, the second conductivity type is P-type. In the present embodiment, the material of the first conductivity type semiconductor layer 121 is, for example, N-type AlGaInP, and the active layer 122 may be preferably a multiple quantum well structure, which may be preferably composed of AlGaInP, and the material of the second conductivity type semiconductor layer 123 is, for example, P-type AlGaInP, and the material of the second conductivity type contact layer 124 may be preferably conductive and pervious to light, such as Indium Tin Oxide, Indium Oxide, Tin Oxide, Cadmium Tin Oxide, Zinc oxide, Magnesium oxide or Titanium Nitride. Further, in various embodiments of the present invention, the epitaxial structure 120 comprises a homo-structure, a single hetero-structure, a double hetero-structure, a multiple quantum well or any arbitrary combination thereof.

Figure 1B:
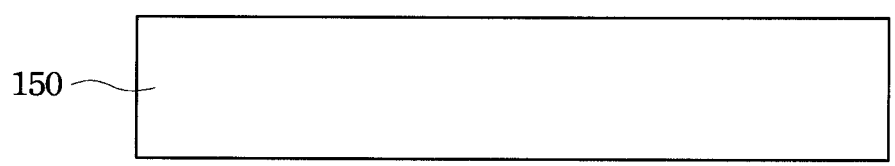

Refer to FIG. 1B. Next, the transparent substrate 150 is provided. The transparent substrate 150 of the present embodiment is made of a transparent material, such as $Al_2O_3$, ZnSe, ZnO, GaP or glass.

Figure 1C:
Figure 1D:
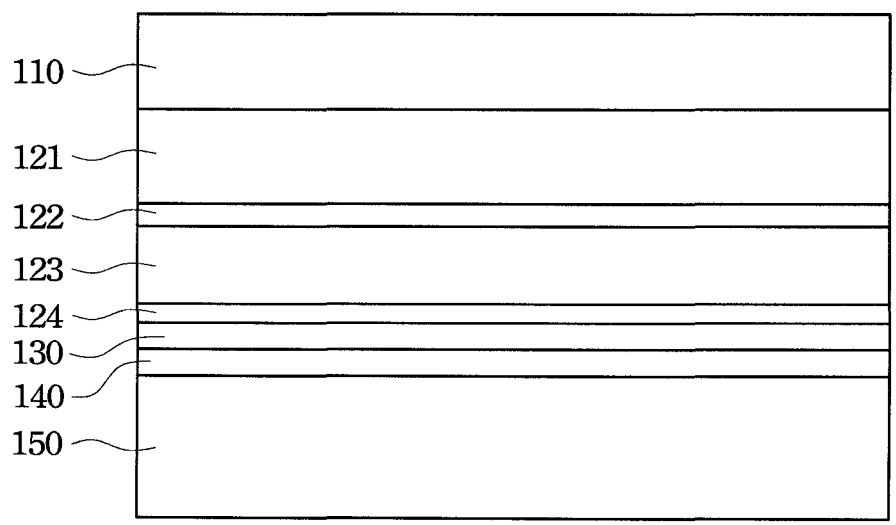
Figure 1E:
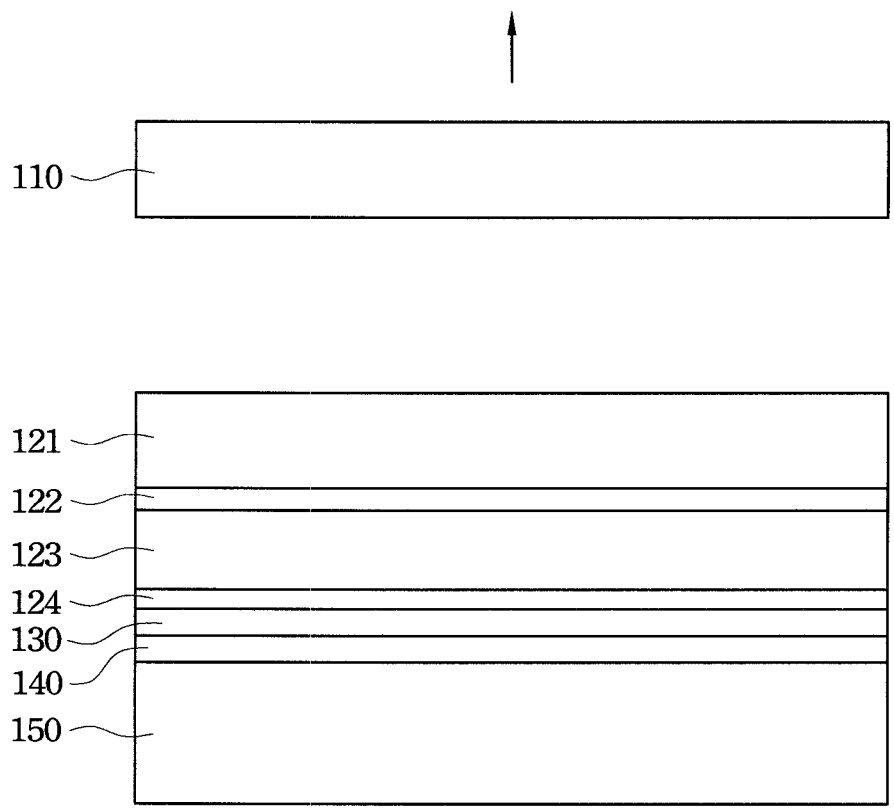
Figure 1F:
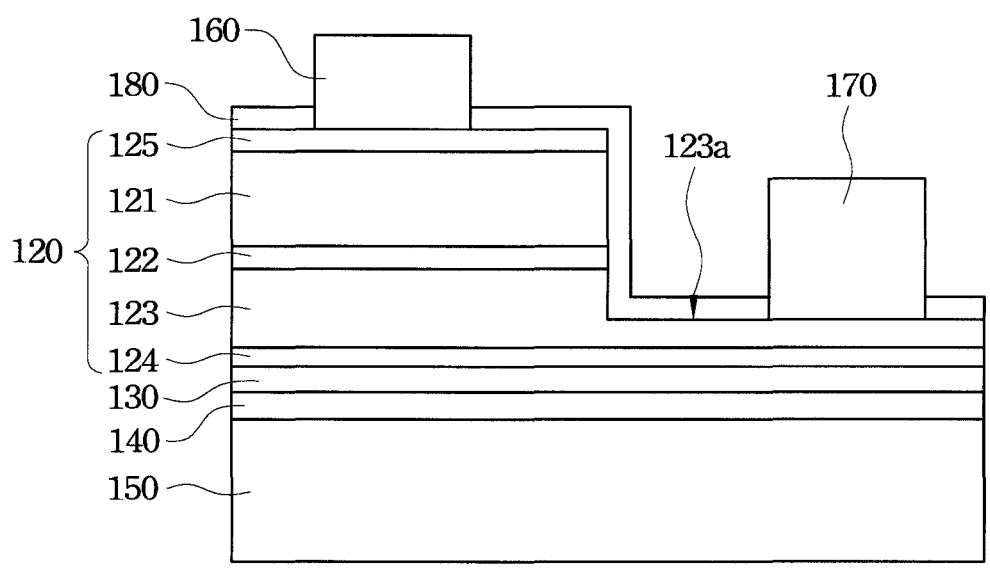

Refer to FIG. 1C. Next, the refraction dielectric layer 140 is formed on the epitaxy structure 120. The refraction dielectric layer 140 is made of a material with high refractive index, such as $SiO_x$, $SiN_x$, $TiO_x$ or $AlO_x$, for refracting the inner light of the light emitting diode 100, thereby increasing the light extraction efficiency and improving the light emitting efficiency, wherein the refractive index thereof is substantially between 1 and 3.

Then, the bonding layer 130 is formed on the refraction dielectric layer 140 with a method such as coating, deposition or evaporation. The material of bonding layer 130 may be silver paste, spontaneous conductive polymer or polymer mixed with conductive material (such as Al, Au, Pt, Zn, Ag, Ni, Ge, In, Sn, Ti, Pb, Cu, Pd or alloys thereof) to bond the epitaxy structure 120 and the refraction dielectric layer 140, so as to process a substrate transferring step.

Refer to FIG. 1D again. Next, the epitaxy structure 120 is bonded on the bonding layer 130 by a method such as wafer bonding.

Refer to FIG. 1E again. Next, the growth substrate 110 is removed, so as to expose the surface of the first conductivity type semiconductor layer 121 of the epitaxy structure 120. The growth substrate 110 is removed by a method, such as a laser lift-off process, an etch process or a chemical mechanical polishing process.

Refer to FIG. 1F again. A first conductivity type contact layer 125 is formed on the first conductivity type semiconductor layer 121 of the epitaxy structure 120. The material of the first conductivity type contact layer 125 may preferably be conductive and pervious to light, such as Indium Tin Oxide, Indium Oxide, Tin Oxide, Cadmium Tin Oxide, Zinc oxide, Magnesium oxide or Titanium Nitride.

Then, a portion of the first conductivity type semiconductor layer 121 and a portion of the active layer 122 is etched by a process such as a dry etch process, a wet etch process or a chemical mechanical polishing process to expose a portion surface 123a of the second conductivity type semiconductor layer 123. Next, the first electrode 160 is formed on the first conductivity type semiconductor layer 125, and the second electrode 170 is formed on the exposed portion surface 123a of the second conductivity type semiconductor layer 123 by a method, such as thermal evaporation, E-beam or sputtering, thereby forming a lateral-conducting structure of the present embodiment. Next, the insulating protecting layer 180 is formed on the exposed surface of the first conductivity type contact layer 125 and the second conductivity type semiconductor layer 123 to package and protect the light emitting diode 100 of the present embodiment. The material of the insulating protecting layer 180 may be silicon containing oxide, nitrides or high dielectric organic material, thereby achieving the light emitting diode 100 of the present embodiment. The material of the first electrode 160 may be In, Al, Ti, Au, W, InSn, TiN, Wsi, $PtIn_2$, Nd/Al, Ni/Si, Pd/Al, Ta/Al, Ti/Ag, Ta/Ag, Ti/Al, Ti/Au, Ti/TiN, Zr/ZrN, Au/Ge/Ni, Cr/Ni/Au, Ni/Cr/Au, Ti/Pd/Au, Ti/Pt/Au, Ti/Al/Ni/Au, Au/Si/Ti/Au/Si, Au/Ni/Ti/Si/Ti or alloys thereof. The material of the second electrode 170 may be Ni/Au, NiO/Au, Pd/Ag/Au/Ti/Au, Pt/Ru, Ti/Pt/Au, Pd/Ni, Ni/Pd/Au, Pt/Ni/Au, Ru/Au, Nb/Au, Co/Au, Pt/Ni/Au, Ni/Pt, NiIn, $Pt_3In_7$ or alloys thereof.

By the optical simulation result, it is realized that in comparison with the conventional light emitting diode, the light emitting diode 100 of the present embodiment can largely increase the light extraction efficiency in axial direction (0 degree) or in lateral direction (0~90 degrees). Therefore, the light emitting diode 100 of the present embodiment can use the refraction dielectric layer 140 to refract the inner light thereof, thereby increasing the light extraction efficiency and the light emitting efficiency.

Figure 2:
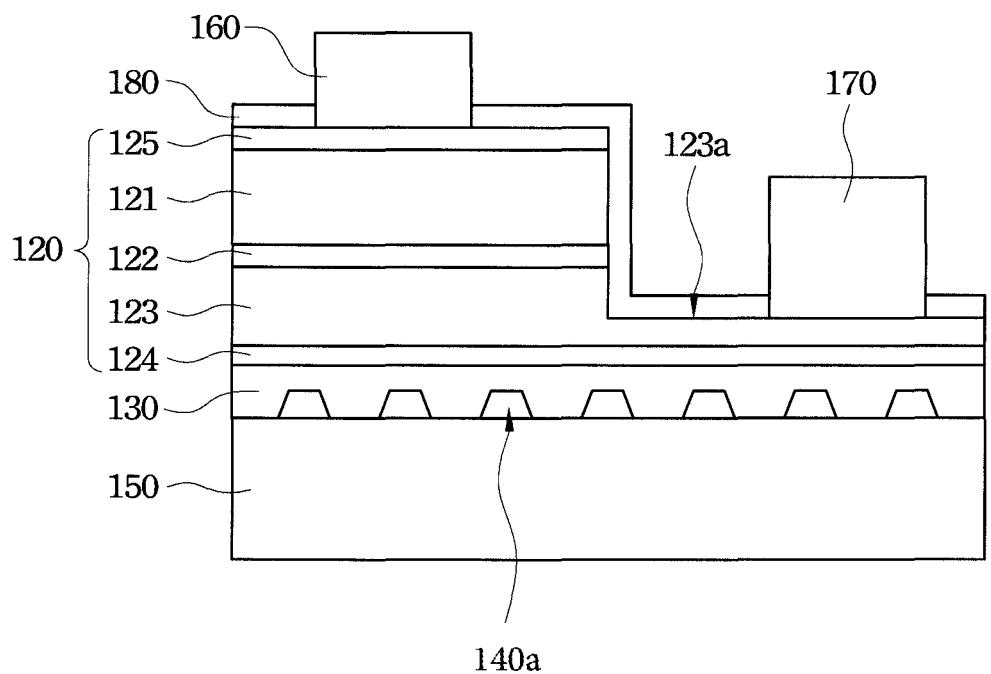
FIG. 2 is a cross-section view showing a light emitting diode according to a second embodiment of the present invention.

Refer to FIG. 2. FIG. 2 is a cross-section view showing a light emitting diode according to a second embodiment of the present invention. Some reference numerals shown in the first embodiment are used in the second embodiment of the present invention. The construction of the light emitting diode shown in the second embodiment is similar to that in the first embodiment with respect to configuration and function, and thus is not stated in detail herein.

Refer again to FIG. 2, in comparison with the first embodiment, the refraction dielectric layer 140a of the light emitting diode 100 of the second embodiment has a pattern structure for further enhancing the refractive effect thereof. The pattern structure of the refraction dielectric layer 140a may include a plurality of cone-shaped structures, and a portion surface of the transparent substrate 150 is exposed. The refraction dielectric layer 140a may be patterned by an etching step, such as dry etching or wet etching, or by a deposition step with a patterned mask (not shown) to deposit the pattern structure thereof. Therefore, the light emitting diode 100 of the second embodiment can use the refraction dielectric layer 140a to further improve the light extraction efficiency and the light emitting efficiency.

Figure 3:
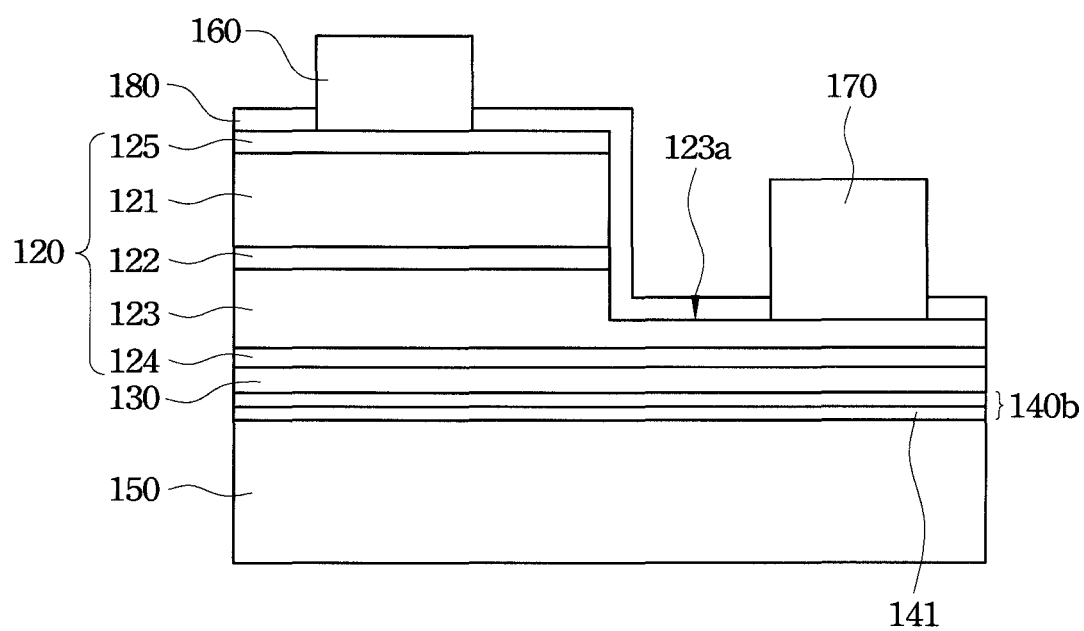
FIG. 3 is a cross-section view showing a light emitting diode according to a third embodiment of the present invention.

Refer to FIG. 3. FIG. 3 is a cross-section view showing a light emitting diode according to a third embodiment of the present invention. Some reference numerals shown in the first embodiment are used in the third embodiment of the present invention. The construction of the light emitting diode shown in the third embodiment is similar to that in the first embodiment with respect to configuration and function, and thus is not stated in detail herein.

Refer again to FIG. 3, in comparison with the first embodiment, the refraction dielectric layer 140b includes a plurality of dielectric layers 141 stacked on the transparent substrate 150 for further enhancing the refractive effect thereof, wherein the refractive index of the dielectric layers 141 may be substantially equal or different. Therefore, the light emitting diode 100 of the third embodiment can use the refraction dielectric layer 140b to further improve the light extraction efficiency and the light emitting efficiency.

Figure 4:
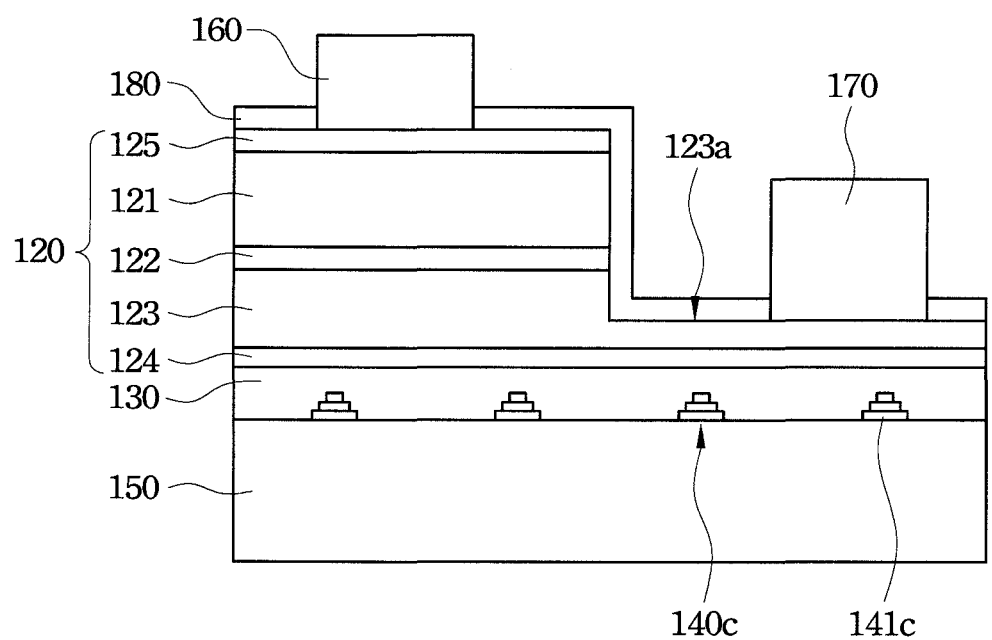
FIG. 4 is a cross-section view showing a light emitting diode according to a fourth embodiment of the present invention.

Refer to FIG. 4. FIG. 4 is a cross-section view showing a light emitting diode according to a fourth embodiment of the present invention. Some reference numerals shown in the first embodiment are used in the fourth embodiment of the present invention. The construction of the light emitting diode shown in the fourth embodiment is similar to that in the first embodiment with respect to configuration and function, and thus is not stated in detail herein.

Refer again to FIG. 4, in comparison with the first embodiment, the refraction dielectric layer 140c includes a plurality of dielectric layers 141c stacked on the transparent substrate 150, where the dielectric layer 140c has a pattern structure, thereby further enhancing the refractive effect thereof. The pattern structure of the dielectric layer 140c may include a plurality of mesa-shaped structures, as shown in FIG. 2 or a plurality of pyramid-shaped, terraced structures 141c, as shown in FIG. 4, and a portion surface of the transparent substrate 150 is exposed. Therefore, the light emitting diode 100 of the fourth embodiment can use the multi-layer pattern structure of the refraction dielectric layer 140c to further improve the light extraction efficiency and the light emitting efficiency.

Figure 5A:
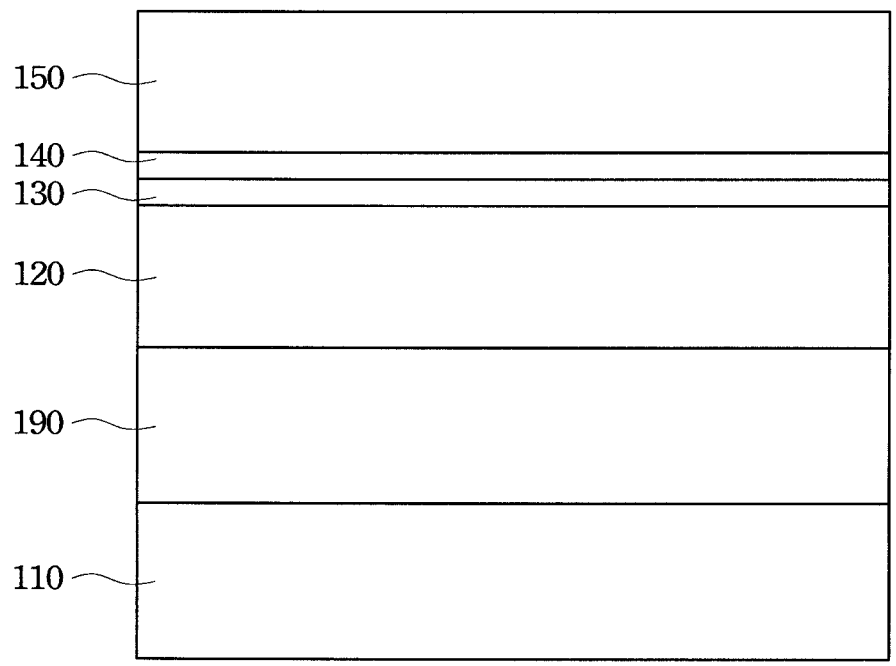
FIG. 5A and FIG. 5B are schematic flow diagrams showing the process for manufacturing a light emitting diode according to a fifth embodiment of the present invention.
Figure 5B:
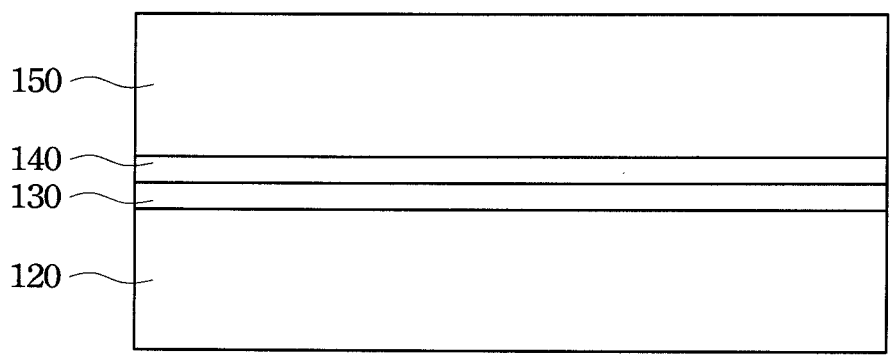

Refer to FIG. 5A and FIG. 5B. FIG. 5A and FIG. 5B are schematic flow diagrams showing the process for manufacturing a light emitting diode according to a fifth embodiment of the present invention. Some reference numerals shown in the first embodiment are used in the fifth embodiment of the present invention. The construction of the light emitting diode shown in the fifth embodiment is similar to that in the first embodiment with respect to configuration and function, and thus is not stated in detail herein.

Refer again to FIG. 5A and FIG. 5B, in comparison with the first embodiment, an etching stop layer 190 is formed on the growth substrate 110. The material of the etching stop layer 190 may be N-type AlGaInP which has an etching rate different from the etching rate of the growth substrate 110. Then, the epitaxy structure 120 is formed on the etching stop layer 190. Next, an etching step is proceeded to remove the growth substrate 110 and the etching stop layer 190 in sequence. Since the etching stop layer 190 is formed between the growth substrate 110 and the epitaxy structure 120, the etching stop layer 190 can prevent the epitaxy structure 120 from over etching.

Therefore, in comparison, the penetrability of the transparent-substrate of the conventional light emitting diode is insufficient, and the reflectivity of the metal reflective material decreases when operating a long time or with a high power, the light emitting diode of the present embodiment can use the refraction dielectric layer to refract the inner light thereof, thereby increasing the light extraction efficiency and the light emitting efficiency.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:
1. A light emitting diode, comprising:
    a transparent substrate;
    a patterned refraction dielectric layer formed on the transparent substrate and exposing a portion of a surface of the transparent substrate, wherein the patterned refraction dielectric layer includes a plurality of dielectric layers stacked on top of each other, wherein the stacked plurality of dielectric layers defines a pattern structure on the transparent substrate, wherein the pattern structure comprises a plurality of mesa-shaped structures, a plurality of pyramid-shaped, terraced structures, a plurality of cone-shaped structures, or a combination of them;
a bonding layer formed on the patterned refraction dielectric layer, wherein a portion of the bonding layer directly contacts the exposed portion of the surface of the transparent substrate;
an epitaxy structure formed on the bonding layer, wherein the epitaxy structure comprises:
a second conductivity type semiconductor layer formed on the bonding layer;
an active layer formed on the second conductivity type semiconductor layer and exposing a portion of a surface of the second conductivity type semiconductor layer; and
a first conductivity type semiconductor layer formed on the active layer, wherein the first conductivity type semiconductor layer and the second conductivity type semiconductor layer have different conductivity types;
a second electrode formed on the exposed portion of the surface of the second conductivity type semiconductor layer; and
a first electrode formed on the first conductivity type semiconductor layer.

2. The light emitting diode as claimed in claim 1, wherein the epitaxy structure further comprises a first conductivity type contact layer and a second conductivity type contact layer, wherein the first conductivity type contact layer is disposed between the first electrode and the first conductivity type semiconductor layer, and the second conductivity type contact layer is disposed between the bonding layer and the second conductivity type semiconductor layer.

3. The light emitting diode as claimed in claim 2, further comprising:
an insulating protecting layer formed on an exposed surface of the first conductivity type contact layer and the second conductivity type semiconductor layer.

4. The light emitting diode as claimed in claim 1, wherein the patterned refraction dielectric layer is made of a material selected from a group consisting of SiOx, SiNx, TiOx and AlOx.

5. The light emitting diode as claimed in claim 1, wherein the transparent substrate is made of a transparent material selected from a group consisting of $Al_2O_3$, ZnSe, ZnO, GaP and glass.

6. A light emitting diode, comprising:
a transparent substrate;
a patterned refraction dielectric layer formed on the transparent substrate and exposing a portion of a surface of the transparent substrate, wherein the patterned refraction dielectric layer includes a plurality of dielectric layers stacked on top of each other, wherein the stacked plurality of dielectric layers defines a pattern structure on the transparent substrate, wherein the pattern structure comprises a plurality of mesa-shaped structures, a plurality of pyramid-shaped, terraced structures, a plurality of cone-shaped structures, or a combination of them, wherein the patterned refraction dielectric layer is made of a material selected from a group consisting of TiOx and AlOx;
a bonding layer formed on the patterned refraction dielectric layer, wherein a portion of the bonding layer directly contacts the exposed portion of the surface of the transparent substrate;
an epitaxy structure formed on the bonding layer, wherein the epitaxy structure comprises:
a second conductivity type semiconductor layer formed on the bonding layer;
an active layer formed on the second conductivity type semiconductor layer and exposing a portion of a surface of the second conductivity type semiconductor layer; and
a first conductivity type semiconductor layer formed on the active layer, wherein the first conductivity type semiconductor layer and the second conductivity type semiconductor layer have different conductivity types;
a second electrode formed on the exposed portion of the surface of the second conductivity type semiconductor layer; and
a first electrode formed on the first conductivity type semiconductor layer.

7. The light emitting diode as claimed in claim 6, wherein the transparent substrate is made of a transparent material selected from a group consisting of $Al_2O_3$, ZnSe, ZnO, GaP and glass.

8. The light emitting diode as claimed in claim 6, wherein the epitaxy structure further comprises a first conductivity type contact layer and a second conductivity type contact layer, wherein the first conductivity type contact layer is disposed between the first electrode and the first conductivity type semiconductor layer, and the second conductivity type contact layer is disposed between the bonding layer and the second conductivity type semiconductor layer.

9. The light emitting diode as claimed in claim 8, further comprising: an insulating protecting layer formed on an exposed surface of the first conductivity type contact layer and the second conductivity type semiconductor layer.

* * * * *